United States Patent [19]

Richard

[11] Patent Number: 4,617,536

[45] Date of Patent: Oct. 14, 1986

[54] AMPLITUDE MODULATION APPARATUS AND METHOD

[75] Inventor: Gordon L. Richard, Minco, Okla.

[73] Assignee: Baptist Medical Center of Oklahoma, Inc., Oklahoma City, Okla.

[21] Appl. No.: 621,181

[22] Filed: Jun. 15, 1984

Related U.S. Application Data

[62] Division of Ser. No. 444,460, Nov. 24, 1982, Pat. No. 4,499,339.

[51] Int. Cl.[4] .................. H03C 1/08; H04R 25/00
[52] U.S. Cl. ..................... 332/37 D; 179/107 FD; 332/38; 332/52; 381/68; 455/108
[58] Field of Search ............... 332/31 R, 31 T, 37 R, 332/37 D, 38, 52; 455/108; 381/68; 179/107 R, 107 FD

[56] References Cited

U.S. PATENT DOCUMENTS

| 2,063,278 | 12/1936 | Von Wedel | 332/38 |
| 4,052,572 | 10/1977 | Schafer | 179/107 R |
| 4,063,048 | 12/1977 | Kissiah, Jr. | 179/107 R |
| 4,225,822 | 9/1980 | Kariatsumari | 332/38 X |

FOREIGN PATENT DOCUMENTS

054450 6/1982 European Pat. Off. .

OTHER PUBLICATIONS

Sigma 7 Cochler Implant Stimulator Unit, Walt Disney Hearing Rehabilitation Research Center, Mar. 1980.

Primary Examiner—Siegfried H. Grimm
Attorney, Agent, or Firm—Laney, Dougherty, Hessin, Claro & Beavers

[57] ABSTRACT

An apparatus and a method modulate a carrier signal so that the resultant modulated signal varies between a value substantially equal to the quiescent level of the carrier signal and peak values up to several hundred percent of the quiescent level of the carrier signal. The apparatus includes an electrical circuit for adjusting the modulating signal so that it is clamped at a reference value to prevent overmodulation. The clamped signal controls a variable resistance mechanism which forms a part of the gain determining portion of a modulator circuit including an amplifier. The amplifier modulates the carrier signal in accordance with the gain determined by the variable resistance. The variable resistance is controlled by the clamped signal so that it causes the gain of the amplifier circuit to vary between approximately one and a value greater than one. So that the apparatus can be used by a person having a hearing impediment wherein the dynamic range detectable by the user is less than the dynamic range detectable by a normal ear, the apparatus also includes a circuit which compresses a detected acoustical signal which is within a first dynamic range into an electrical modulating signal within a dynamic range which is smaller than the first dynamic range and which is within the dynamic range perceivable by the user of the apparatus.

15 Claims, 5 Drawing Figures

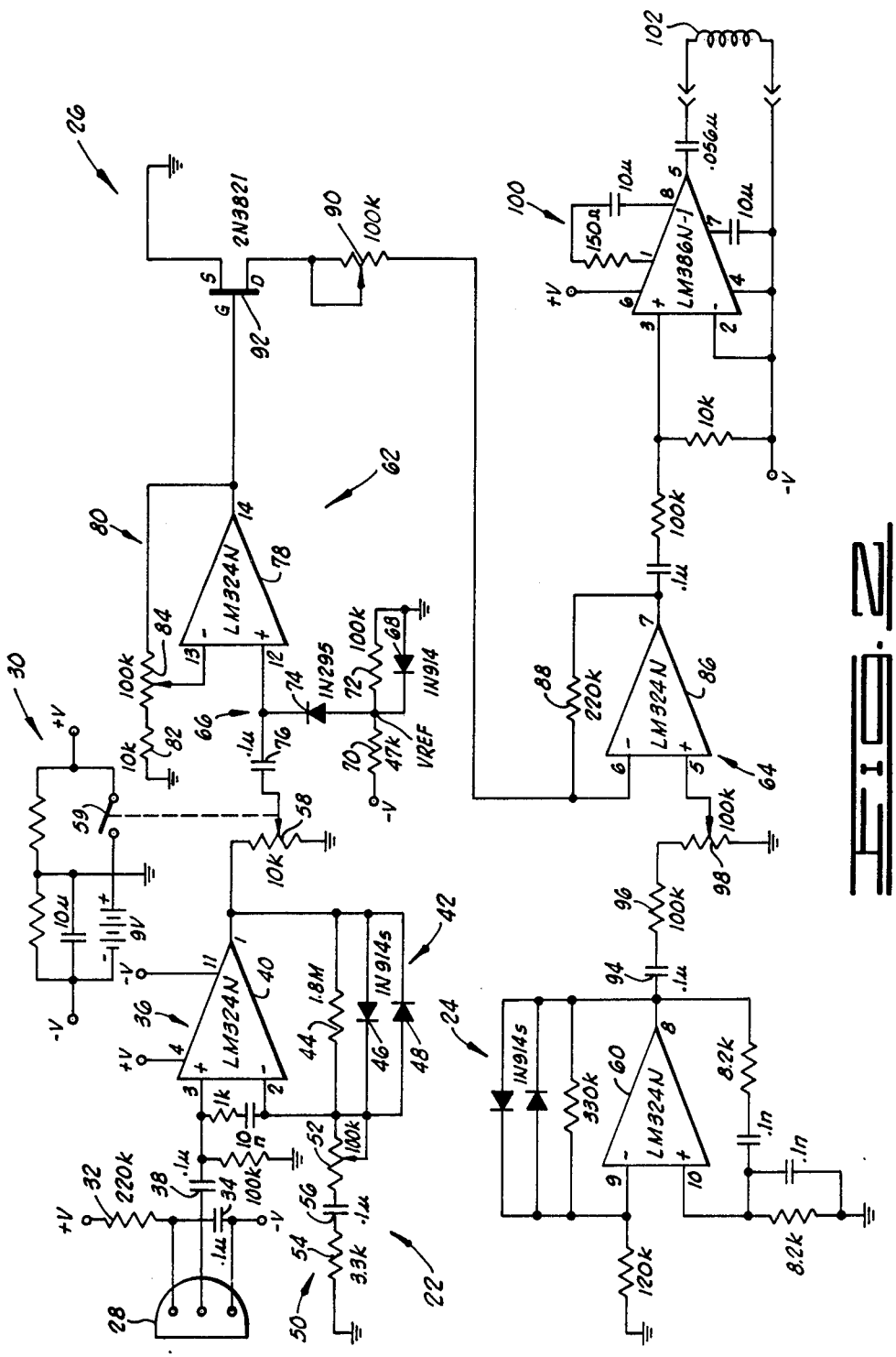

AMPLITUDE MODULATION APPARATUS AND METHOD

This is a division of application Ser. No. 444,460, filed Nov. 24, 1982, now U.S. Pat. No. 4,499,339.

BACKGROUND OF THE INVENTION

This invention relates generally to amplitude modulation apparatus and methods and more particularly, but not by way of limitation, to apparatus and methods for aiding deaf people to detect acoustical signals.

In the basic process of conventional amplitude modulation, the amplitude of a carrier signal is modified by a modulating signal to produce a modulated signal. The carrier signal is often a sine wave of constant amplitude whose frequency is much higher than that of the modulating signal. This type of carrier signal can be mathematically represented by the expression $A_c \cos\omega_c t$, where $A_c$ represents the amplitude of the carrier signal and $\omega_c$ represents the radian frequency of the carrier signal. The modulating signal, on the other hand, is usually a complex waveform, such as the output of a microphone which is detecting speech or music. For the following mathematical analysis, we can express the modulating signal by the expression $V(t)$ which indicates that the instantaneous value of the modulating signal is a function of time in some undisclosed relationship.

In a conventional amplitude modulation apparatus, a mathematical product of the carrier signal and the modulating signal is formed. For the aforementioned signals, this product is expressed $M(t) = [1 + kV(t)]A_c \cos\omega_c t$. That is, the amplitude modulation apparatus takes a portion $k$ of the modulating signal $V(t)$, adds it to a constant (1 in this case), then multiplies the sum by the mathematical representation of the carrier signal. This produces the modulated signal, $M(t)$. The quantity $[1 + kV(t)]$ is called the modulating function, and $k$ is called the modulation factor.

It is apparent that if the modulating function is zero, $M(t)$ will also be zero. The modulating function goes to zero whenever the quantity $kV(t)$ goes to $-1$. When this occurs at the most negative values of $V(t)$, the carrier signal is said to be 100% modulated.

If the quantity $kV(t)$ becomes more negative than $-1$, thereby making the modulating function negative, a condition called "overmodulation" occurs whereby the modulated signal, $M(t)$, becomes negative. When $M(t)$ becomes negative, the actual modulated signal experiences a 180° phase shift because $-A_c \cos \omega_c t = A_c \cos(\omega_c t + \pi)$. Such a phase shift introduces distortion into the modulated signal. This distortion is manifested in the form of additional frequency components which were not a part of the original modulating signal $V(t)$. The severity of the distortion is determined by the extent of overmodulation.

From this brief review of the basics of conventional amplitude modulation, it is apparent that any carrier signal of any chosen amplitude will be 100% modulated by a modulating signal if the reciprocal of $k$ equals the absolute value of $V(t)$. The carrier signal will be overmodulated if the reciprocal of $k$ is less than the absolute value of $V(t)$. Therefore, overmodulation can be prevented by limiting the magnitude of $V(t)$ so that its absolute value is not greater than the reciprocal of $k$; however, this limitation also prevents the carrier signal from being modulated to more than twice its quiescent, or unmodulated, amplitude. For example, if $V(t) = \pm 3$ volts zero-to-peak and $k = \frac{1}{3}$, this assures that $kV(t)$ will not go more negative than $-1$, thereby insuring that overmodulation will not occur. However, this also limits the magnitude of the modulating function to two when $V(t)$ reaches its maximum positive peak, thereby limiting the upward modulation of the carrier signal to only twice its quiescent value.

From this example it is apparent that ordinarily a carrier signal can be modulated-up to not more than twice its quiescent value if overmodulation is to be avoided during the negative-going portion of the modulating signal. This is true as long as the modulation process is symmetrical and in accordance with the aforementioned equation for $M(t)$. For this equation to be valid, the complex modulating signal $V(t)$ must have no direct current bias. That is, it must be balanced about zero volts and the area under the curve representing its positive-going portion must equal the area under the curve representing its negative-going portion. Additionally, the signal $V(t)$ must have peak values which are equal in both the positive and negative directions if the modulation-up magnitude is to equal the modulation-down magnitude. If it is desirable to achieve asymmetrical modulation, then limiting of either the positive-going excursions or the negative-going excursions of the modulating signal can be effected. However, care must be exercised in the method used to limit the excursions of the modulating signal because any changes to the modulating signal will result in distortions. Certain distortions can render the subsequent modulated signal unacceptable.

Amplitude modulation is, of course, well known and its uses are also well known. One of these uses is to assist people who have hearing impediments which prevent them from properly responding to acoustical signals in the same manner as those who have normal hearing. For example, it has been discovered that a person with a severe hearing problem, such as substantially total hearing loss, can be aided in properly responding to acoustical signals through the use of a cochlear implant device which is connected to the output of an amplitude modulation apparatus. An example of a cochlear implant device is disclosed in U.S. Pat. No. 4,352,960.

In the case of the cochlear implant application, it is necessary to produce a suitable amplitude modulated signal comprising a carrier signal modulated by a microphone signal. The microphone signal is an electrical signal representative of ambient sounds, such as the voice of one speaking to the person having the cochlear implant device. For this usage, it is desirable that the amplitude of the modulated signal be maintained between an upper limit and a lower limit. The specific upper and lower limits vary for each individual, but preferably the limits range from the threshold of perception of the individual up to the discomfort level of the person. It has been found that this range is typically between approximately 2 volts zero-to-peak and volts zero-to-peak. Because this exemplary upper limit is more than twice the exemplary lower limit, it is apparent that an amplitude modulation apparatus and method which are able to vary a carrier signal by more than the basic factor of two, but which do not overmodulate, are required.

It is a further need that in the absence of a modulating signal (e.g., when there are no ambient sounds), the modulated signal which drives the cochlear implant device and which is essentially the carrier signal with little or no modulation remain at or just below the person's lower limit so that when any sound is detected, the carrier signal will be modulated to an amplitude above the perception threshold. However, this need is also not achievable by the conventional amplitude modulation operation because in the conventional amplitude modulation operation the quiescent level is at the median value between the upper and lower modulation limits rather than at the lower limit.

Therefore, in view of the shortcomings of the conventional amplitude modulation operation, there is needed an apparatus and method whereby a carrier signal can be modulated up from a quiescent value but not significantly modulated down so that the output of the modulation circuit or process is maintained at or near the quiescent value of the carrier signal when no or little modulation of the carrier signal occurs. There is also the need for such apparatus and method to be able to modulate the carrier signal up by more than the conventional factor of two, but without overmodulating the carrier signal, so that the full dynamic range of the person's auditory perception can be utilized. By meeting these needs, an amplitude modulation auditory stimulation apparatus having a quiescent unmodulated output voltage set at or just below the user's perception threshold and further having a modulation-up factor calibrated so that the modulated output voltage does not exceed the user's upper tolerance limit under any conditions of ambient sound can be achieved.

In addition to the foregoing needs which have been identified specifically with reference to people with hearing impediments, there is generally a need in the field of radio communications for an apparatus and a method for producing large amplitude variations on a carrier signal without producing significant distortion arising from overmodulation. The fulfillment of the need would enable a strong signal to be transmitted without requiring a high level of average power. For example, a small battery-operated transceiver could be provided, which transceiver would conserve the battery power and yet would send strong signals receivable at distances previously attainable only by higher-powered transmitters. Such apparatus and method provided by the fulfillment of this need would possibly have military, citizens band, and commercial radio applications.

Although the basic amplitude modulation device and method are known, as are amplitude modulation devices and methods which are to aid the hearing impared, these prior devices and methods do not meet the aforementioned needs.

SUMMARY OF THE INVENTION

The present invention overcomes the above-noted and other shortcomings of the prior art by providing a novel and improved amplitude modulation apparatus and method, particularly, but not by way of limitation, of the type which provides an output signal to assist ones who have hearing impediments and who have been implanted with a cochlear implant device, for example.

The present invention maintains the output signal (i.e., the modulated signal) between lower and upper limits of a person's stimulus perception range. It achieves this by maintaining the output signal at or just below the person's lower limit of perception when there is no ambient sound, and by modulating the carrier signal up to the person's upper stimulus tolerance limit in accordance with the magnitude of the detected sound when the environment is not quiet. This modulation-up can be by a factor greater than two and without the occurrence of overmodulation.

Broadly, the apparatus of the present invention provides an improvement in an amplitude modulation apparatus of the type wherein a modulating signal having a peak-to-peak value is used for modulating a carrier signal having a quiescent peak-to-peak value when no modulating signal is present. This improvement comprises modulation means for providing a modulated signal having peak-to-peak values within a range, and only within the range, between a value substantially equal to the quiescent peak-to-peak value and a value which is a multiple of the quiescent peak-to-peak value, which multiple is determined by the modulating signal peak-to-peak value. This modulation means includes signal adjustment means for modifying the amplitude of the modulating signal, and it also includes modulator means, responsive to the signal adjustment means, for amplifying the carrier signal by variable amplification, or multiplication, factors. The variable amplification factors are dependent upon the modified amplitude of the modulating signal.

In one embodiment of the invention, the modulating signal is obtained by means for generating an electrical signal from an acoustical signal so that the electrical signal is within a dynamic range which is smaller than the dynamic range of the acoustical signal.

From the foregoing it is a general object of the present invention to provide a novel and improved amplitude modulation apparatus and method. Other and further objects, features and advantages of the present invention will be readily apparent to those skilled in the art when the following description of the preferred embodiment is read in conjunction with the accompanying drawings.

BRIEF DESCRIPTION OF THE DRAWINGS

FIG. 2 is a schematic circuit diagram of a preferred embodiment of an apparatus constructed in accordance with the present invention.

DETAILED DESCRIPTION OF THE PREFERRED EMBODIMENT

With reference to the drawings, the preferred embodiment of the apparatus and method constructed and performed in accordance with the present invention will be described.

Figure 1A:
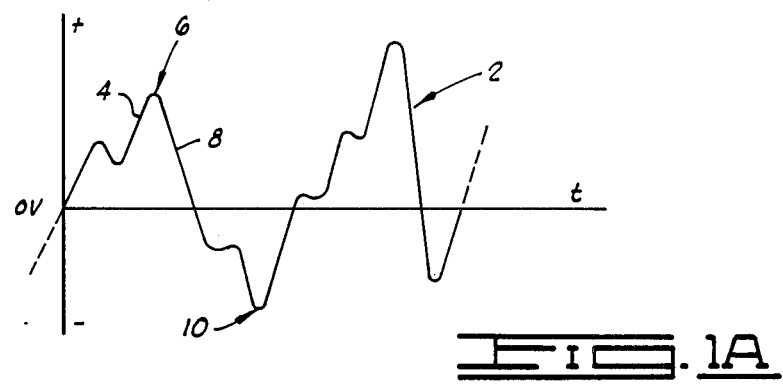
FIG. 1A is an illustration of a modulating signal.

With reference to FIGS. 1A-1D, examples of the signals to be considered with the present invention will be described. In FIG. 1A there is shown a transducer signal 2, such as an electrical signal derived from an acoustical signal as will be more fully described subsequently. The transducer signal 2 is an analog, time-varying signal experiencing magnitude excursions in two directions (i.e., positive or upward excursions and negative or downward excursions) between upper peak values and lower peak values. For example, the transducer signal 2 includes a positive excursion 4 extending to an upper peak value 6 from which a negative excursion 8 extends to a lower peak value 10. The acoustical signal is the signal to which the present invention initially responds and can be broadly referred to as a modulating signal (as can the corresponding electrical transducer signal 2) because it is the input which causes the modulation described hereinbelow.

Figure 1B:
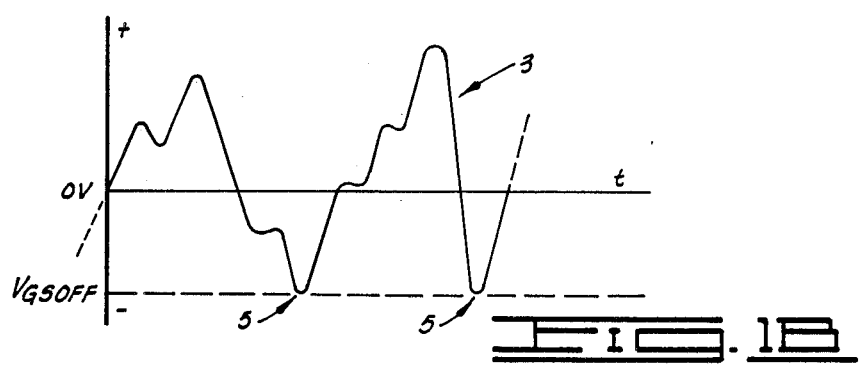
FIG. 1B is an illustration of a clamped modulating signal.

In FIG. 1B there is shown a clamped transducer signal 3 which is derived from the transducer signal 2 by a signal conditioning circuit which will be described subsequently. The signal 3 differs from the signal 2 in that the signal 3 has been shifted upward or downward by a continually varying amount just sufficient to cause its lower peak values 5 to generally have an equal value. This value is determined by a reference voltage of a clamp circuit in the signal conditioning circuit as will be described hereinbelow.

The clamped transducer signal 3 can also be referred to as a modulating signal because it is the signal which is used in the preferred embodiment of the present invention to directly modulate a carrier signal. For purposes of clarity, the acoustical signal and/or the resultant transducer signal 2 will be alternatively referred to hereinbelow as the modulating signal 2, and the clamped transducer signal 3 will be alternatively referred to as the conditioned modulating signal 3.

Broadly, the modulating signal 2 is used to modulate a carrier signal so that the resultant modulated signal can be used to, for example, drive a cochlear implant device of the type disclosed in U.S. Pat. No. 4,352,960. In this particular exemplary application, the modulating signal 2 is converted into the conditioned modulating signal 3 which directly controls the modification or modulation of the carrier signal so that a resultant modulated signal is provided, which modulated signal enables a user of the cochlear implant device to perceive something within his or her range of detection defined by a lower stimulus detection limit and an upper stimulus tolerance limit. In terms of electrical voltages, this range can be, for example, between 2 volts zero-to-peak and 10 volts zero-to-peak.

Figure 1C:
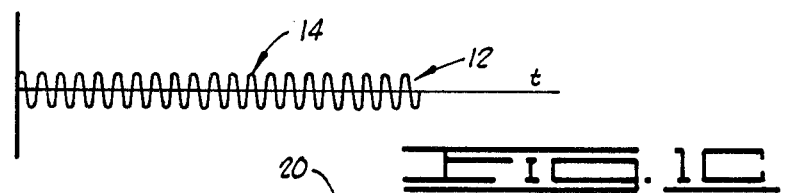
FIG. 1C is an illustration of a carrier signal.

FIG. 1C discloses an example of the aforementioned carrier signal which is identified by the reference numeral 12. The carrier signal 12 has a frequency which is greater than any of the frequency components of the conditioned modulating signal 3. The unmodulated carrier signal 12 has a constant peak (i.e., zero-to-peak) magnitude 14 which is referred to as the quiescent peak magnitude or value. Quiescent is used to indicate the situation where no modulating signal is present, which situation occurs in a quiet environment for the preferred embodiment described herein. In the preferred embodiment the carrier signal 12 is a sine wave having a frequency of approximately 16 kHz for use with the cochlear implant device disclosed in U.S. Pat. No. 4,352,960.

Figure 1D:
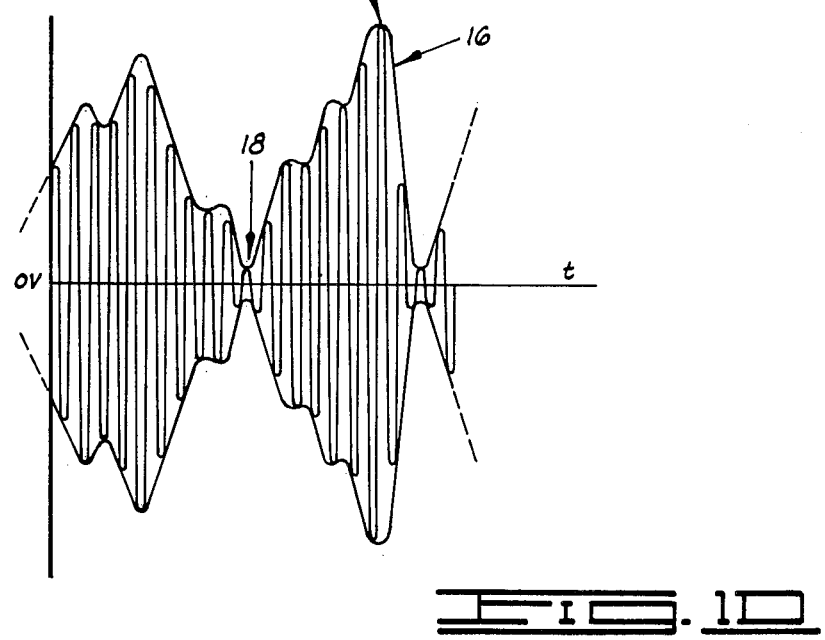
FIG. 1D is an illustration of the carrier signal modulated by the present invention in response to the modulating signal.

FIG. 1D discloses a modulated signal 16 which is achieved by means of the present invention modulating the carrier signal 12 by the conditioned modulating signal 3 derived from the modulating signal 2. It is apparent that the modulated signal 16 represents a several hundred percent modulation-up of the quiescent value of the carrier signal 12 with little or no modulation-down thereof. The modulated signal 16 has peak-to-peak values within a range, and only within the range, between a value which is substantially equal to the quiescent peak-to-peak value of the carrier signal 12 and a value which is a multiple of the quiescent peak-to-peak value. In the preferred embodiment this multiple is positive and greater than two. Stated differently, the modulated signal 16 has a peak-to-peak amplitude which is variable between a minimum peak-to-peak magnitude 18, which is substantially equal to the quiescent peak-to-peak magnitude of the carrier signal 12, and a maximum peak-to-peak magnitude 20 which is within the range of stimulus signal magnitudes perceivable and tolerable by a person using the present invention and defined by the aforementioned lower stimulus detection limit and the upper stimulus tolerance limit.

The apparatus of the present invention by which the modulated signal 16 is achieved includes an improvement in an amplitude modulation apparatus of the type wherein a modulating signal, such as the acoustical signal or its electrical representation identified in FIG. 1A as the transducer signal 2, is used for modulating a carrier signal, such as the carrier signal 12. This improvement includes a modulation means which is implemented by an electrical circuit schematically shown in a preferred embodiment in FIG. 2. The modulation means will be described with reference to its preferred embodiment environment of an apparatus for aiding a person to detect an acoustical signal, which person is responsive to the range of stimulus signal magnitudes defined by the lower stimulus detection limit and the upper stimulus tolerance limit. In this preferred embodiment environment, the stimulus to which the person responds is an electrical signal, such as one provided via the aforementioned cochlear implant device. This apparatus broadly includes transducer means 22, carrier signal generating means 24, and the modulation means, generally identified in FIG. 2 by the reference numeral 26. Each of these three elements will be described with reference to the preferred embodiment shown in FIG. 2.

The transducer means 22 receives an ambient signal, such as an acoustical signal, and converts the received signal into an electrical signal, such as the transducer signal 2. In the preferred embodiment, the detected ambient signal is an acoustical signal within a first dynamic range, such as the approximately 100 dB range between approximately 15 dB and approximately 115 dB which is the dynamic range of a normal human ear. In the exemplary use of the present invention with a deaf person having no normal hearing, but having been implanted with a cochlear implant device, the maximum dynamic range perceivable by such person is typically less than 5 or 10 dB. Therefore, the transducer means 22 of the preferred embodiment includes means for generating the electrical signal from the acoustical signal so that the electrical signal is within a second dynamic range which is smaller than the first dynamic range within which the acoustical signal may fall.

In the preferred embodiment the electrical signal generating means of the transducer means includes a microphone 28, such as an Electret microphone having an integral field effect transistor amplifier as known to the art. The microphone 28 is energized from the +V and −V power supply used throughout the apparatus. The power supply is schematically shown in FIG. 2 and identified by the reference numeral 30. This is of a type known to the art. To minimize noise caused by the power supply 30, a resistor 32 and a capacitor 34 provide a noise filter. The microphone 28 transduces the detected acoustical signal into an electrical microphone output signal.

The electrical signal generating means also includes amplifier means 36 which receives the microphone output signal from the microphone 28 through a coupling capacitor 38. The amplifier means 36 amplifies the acoustical signal as represented by the electrical signal from the microphone 28 by a variable factor defined by an equation including a numerator and a denominator as known to the art and as further described hereinbelow. In the preferred embodiment this variable factor is the gain of an operational amplifier 40 which forms a part of the amplifier means 36. The operational amplifier 40 has a non-inverting input, an inverting input, and an output as known to the art.

The amplifier means 36 also includes amplitude responsive means 42 for decreasing the numerator of the gain factor as the amplitude of the acoustical signal, and this of the electrical signal from the microphone 28, increases. As shown in FIG. 2, the amplitude responsive means 42 includes a resistor 44 and two diodes 46 and 48 connected in electrical parallel between the inverting input and the output of the operational amplifier 40.

The amplifier means 36 also includes frequency responsive means 50 for increasing the denominator of the gain factor as the frequency of the acoustical signal, and thus of the electrical signal from the microphone 28, decreases. As shown in FIG. 2, the frequency responsive means 50 includes resistors 52 and 54 and a capacitor 56. These elements are connected in electrical series between the inverting input of the operational amplifier 40 and an electrical reference specifically shown as the common ground potential.

The amplitude responsive means 42 and the frequency responsive means 50 function in their described manners for the following reasons. Regarding the amplitude responsive means 42, the operational amplifier 40 is a linear operational amplifier having its variable AC gain determined by the resistors 44, 52, and 54 for small amplitude signals: gain$=1+[R_{44}/(R_{52}+R_{54})]$. For higher amplitude signals which exceed the forward voltage of the diodes 46 and 48, the gain is limited as these diodes begin to conduct and thereby reduce the effective resistance value in the numerator of the foregoing equation. For these higher amplitude signals, the gain is compressed according to the logarithmic properties of the diodes 46 and 48. The resistor 52 is a potentiometer in the preferred embodiment so that it can be adjusted to cause the amplifier logarithmic knee to occur at, for example, a free-field sound level of approximately 85 dB, and rolling off to a maximum output in response to an acoustical signal of about 115 dB, such as is the case with a person of normal hearing.

Regarding the frequency responsive means 50, for DC signals (i.e., ones with zero frequency), the gain of the operational amplifier 40 is limited to a factor of approximately one by the frequency responsive means 50 because the capacitor 56 acts as an effective open circuit to DC signals so that the aforementioned gain equation approximately equals one as the denominator of the second term approaches infinity for an open circuit. Very low frequency signals are similary not amplified by a gain factor of much greater than one because of the response of the capacitor 56 to such very low frequency signals.

The output of the operational amplifier 40 is an electrical signal which is similar to the electrical signal provided by the microphone 28 except that the amplitude of the operational amplifier 40 output is compressed in accordance with the operation of the foregoing elements. This amplitude compressed signal is provided to a potentiometer 58 which functions as the volume control for the apparatus of the present invention. As indicated by the dashed line in FIG. 2, the volume control potentiometer 58 is associated with an on/off switch 59 of the power supply circuit 30. This amplitude compressed signal, as adjusted by the potentiometer 58, is exemplified by the transducer signal 2 shown in FIG. 1A. This amplitude compressed signal is to be modified by a modulating signal adjustment, or conditioning, means of the modulation means 26, as described subsequently, to produce a conditioned modulating signal (e.g., the modulating signal 3) directly used to modulate a carrier signal (e.g., the carrier signal 12) generated by the carrier signal generating means 24.

The carrier signal generating means 24 generates, for the examples shown in FIGS. 1A-1D, the carrier signal 12 having the quiescent peak magnitude 14. In the preferred embodiment of the present invention the quiescent magnitude 14 is amplified by a modulator means of the modulation means 26, as will be described more fully hereinbelow, so that the resultant signal has a quiescent magnitude which is substantially equal to the lower stimulus detection limit of the person for whom the apparatus is intended. As shown in FIG. 2 the preferred embodiment of the carrier signal generating means 24 includes an operational amplifier 60 having the elements shown in FIG. 2 associated therewith as known to the art for providing an oscillator. In the preferred embodiment the oscillator provides a carrier signal having a frequency of approximately 16 kHz. This carrier signal is to be modulated by means of the modulation means 26 in response to, broadly, the modulating signal such as the acoustical signal or transducer signal 2 and, particularly, the conditioned modulating signal such as the clamped transducer signal 3 provided at the output of the aforementioned signal adjustment, or conditioning, means identified in the preferred embodiment of FIG. 2 by the reference numeral 62.

The signal adjustment means 62 forms a part of the modulation means 26 and is used for modifying the waveform of the transducer signal provided at the wiper of the potentiometer 58. The output of the signal adjustment means 62 is the conditioned modulating signal which directly controls the operation of the aforementioned modulator means identified in the preferred embodiment of FIG. 2 by the reference numeral 64. The modulator means 64 is used for amplifying the carrier signal by variable amplification factors which are dependent upon the instantaneous amplitude of the conditioned modulating signal. By a signal clamping means 66 which is known to the art, the signal adjustment means 62 shifts the signal from the transducer means 22 up or down by a continuously varying amount as required to bring each principal lower peak to a value determined by a reference voltage ($V_{ref}$) which is produced in the preferred embodiment by the forward voltage drop ($V_f$) of a diode 68 in association with resistors 70 and 72 connected between ground and $-V$, which diode and resistors form the preferred embodiment of a clamp reference voltage means. The signal clamping means 66 (by means of which the transducer signal is clamped to the reference voltage in a manner familiar to the art) of the preferred embodiment includes a diode 74 and a capacitor 76. The diode 74 has its anode electrically connected to the cathode of the diode 68 and the common junction of the resistors 70 and 72, and the capacitor 76 has one end electrically connected to the wiper of the potentiometer 58. The other end of the capacitor 76 and the cathode of the diode 74 are electrically connected to the non-inverting input of an operational amplifier 78.

In response to the signal at the non-inverting input thereof, the operational amplifier 78 provides the conditioned modulating signal at the output thereof. The operational amplifier 78 forms a part of an amplifier means 80 for amplifying the unamplified clamped transducer signal at the input thereof, thereby providing the amplified clamped transducer signal as exemplified in FIG. 1B by the signal 3. Both the DC and the AC gains of the operational amplifier 78 are determined by resistors 82 and 84 wherein the resistor 84 is a potentiometer used for adjusting the gains. By appropriate adjustment of the potentiometer 84, the output signal of the operational amplifier 78 is properly set for controlling the modulator means 64.

The modulator means 64 of the preferred embodiment is an amplifier means which multiplies the magnitude of the carrier signal by variable multiplication factors which are dependent upon the conditioned modulating signal provided at the output of the operational amplifier 78. The modulator means 64 includes an operationa amplifier 86 having its gain determined by a resistor 88, a resistor 90 (shown as a potentiometer) and the resistance between the drain and source ($R_{DS92}$) of a field effect transistor 92. This gain is represented by the equation $1+[R_{88}/(R_{90}+R_{DS92})]$ as known to the art. The transistor 92 is the preferred embodiment implementation of a voltage-controlled variable resistance means for providing a first resistance when the magnitude of the conditioned modulating signal is at its predetermined lower value (represented by the number 5 for the waveform of FIG. 1B) and for providing a variable, smaller resistance when the magnitude of the conditioned modulating signal is other than the predetermined value (specifically, above the predetermined value in the preferred embodiment). The variable resistance means represented by the transistor 92 is controlled by the output from the operational amplifier 78 of the signal adjustment means 62. Because the resistance of the transistor 92 is variable, it is apparent that the gain, or amplification factor, of the operational amplifier 86 is also variable in accordance with the magnitude of the effective drain-to-source resistance of the transistor 92. The variable resistance means is maintained at a maximum resistance by the clamped reference voltage means when no modulating signal is present.

As known to the art, the transistor 92 has a cut-off voltage. When the transistor 92 is maintained at or near its cut-off voltage it has the aforementioned maximum resistance. It is this cut-off voltage at or near which the transistor 92 is maintained by the clamped reference voltage means and the amplification thereof provided by the amplifier means 80 when no modulating signal is present. When a modulating signal is present, it is clamped by the signal adjustment means 62 and provided to the gate terminal of the transistor 92, which terminal is electrically connected to the output of the operational amplifier 78 for receiving the clamped signal therefrom.

The operational amplifier 86 of the modulator means 64 includes a non-inverting input to which the carrier signal is coupled by suitable coupling means shown in FIG. 2 to include a capacitor 94, a resistor 96, and a variable resistor 98. It is to be noted that the variable resistors 90 and 98 are used for setting the quiescent level of the carrier and the maximum level of the modulated signal. That is, the two variable resistors are used in combination to define the specific window or range of magnitudes between which the carrier signal will be modulated.

As will be more specifically described hereinbelow with reference to the operation of the present invention, the elements of the modulation means 26 are used for modulating the carrier signal in response to the modulating signal so that the peak-to-peak amplitude of the resultant modulated signal is variable between a minimum peak-to-peak magnitude which is substantially equal to the quiescent peak-to-peak magnitude of the carrier signal and a maximum peak-to-peak magnitude which is within the range of usable signal magnitudes defined by the lower stimulus detection limit and the upper stimulus tolerance limit of a person using the apparatus. In the preferred embodiment the lower stimulus detection limit is the perception threshold limit, whereas the upper stimulus tolerance limit is the discomfort threshold of the person using the apparatus. It is to be noted that although the foregoing amplitudes or magnitudes have been referred to as "peak-to-peak" values, they can also be defined by reference to "peak" (i.e., zero-to-peak) values.

The apparatus of the present invention as shown in its preferred embodiment in FIG. 2 further includes a coil driver means 100 of a type known to the art. The coil driver means 100 suitably conditions the modulated signal provided at the output of the operational amplifier 86 for driving a coil 102 of a type such as is disclosed in U.S. Pat. No. 4,352,960. The coil 102 represents the external coil of the cochlear implant device shown in U.S. Pat. No. 4,352,960.

The circuit schematically illustrated in FIG. 2 is to be packaged in a suitable package having a size in its preferred embodiment which accommodates the package being placed in a shirt pocket or otherwise easily carried by a person who is to use the apparatus with the aforementioned cochlear implant device. The packaging may be of any suitable type known to the art. Externally of the package there is provided the actuation knob for the potentiometer 58 and its associated on/off switch 59 of the power circuit 30.

It is to be noted that the resistors and capacitors as shown in FIG. 2 are listed in ohms and farads, respectively. Additionally, such values and the specific construction of the elements illustrated in FIG. 2 are for purposes of disclosure of the preferred embodiment, but are not to be taken as limiting the invention.

In operation, the transducer signal provided in its compressed form at the output of the operational amplifier 40 is coupled to the signal adjustment means 62. When there is no modulating signal present, the signal adjustment means 62 provides a suitable DC bias to the gate terminal of the transistor 92 so that the transistor 92 is maintained near cut-off. For the circuit shown in FIG. 2, this is nominally about −3 volts. This biasing is achieved by utilizing the clamped reference voltage of approximately −0.6 volts provided at the cathode of the diode 68. This clamped reference voltage is amplified to the suitable DC bias level by means of the amplifier means 80. The above DC bias level is adjusted to its exact required magnitude by the potentiometer 84.

When the modulating or transducer signal is present, clamping thereof is produced by the diode 74 and the capacitor 76. The clamping action has a reference voltage which is provided by the clamp reference voltage means.

The clamp time constant or release time is determined by the capacitor 76 and the reverse current $I_r$ of the diode 74. Because the operational amplifier 78 has a high input impedance, it has little effect on the clamp time constant. For the elements shown in FIG. 2, the time constant is approximately 10 milliseconds. The reciprocal of five times this time constant is 20 Hz; therefore, good clamping is achieved for the principal component of any normal audio frequency signal.

With negative clamping thus achieved, and the clamped signal serving as the AC input to the non-inverting input of the operational amplifier 78, the AC output of the operational amplifier will also be negative-clamped. The clamping-point voltage of the output will be different, however, as determined by the gain established by the resistor 84. Thus, this negative-clamped variant of the transducer signal is positive-going from the clamped level which, in the preferred embodiment, is set at or near the cut-off voltage of the transistor 92 to which the negative-clamped variant is connected. Stated another way, by appropriate adjustment of the potentiometer 84, the output signal of the operational amplifier 78 is set so that the lower peak values (such as the lower peak values 5 of the signal 3) of the output signal have a voltage value approximately equal to the cut-off voltage ($V_{GSoff}$ shown in FIG. 1B) of the transistor 92.

This negative-clamped variant of the transducer signal controls the effective drain-to-source resistance of the transistor 92 and thereby also controls the gain of the operational amplifier 86 in accordance with the equation: gain $= 1 + [R_{88}/(R_{90}+R_{DS92})]$. This is the variable amplification factor of the modulator means 64 for a signal connected to the non-inverting input of the operational amplifier 86.

In the preferred embodiment, the carrier signal is connected to the non-inverting input of the operational amplifier 86; therefore, the carrier signal is modulated in accordance with the variation in the effective resistance of the transistor 92. In view of the manner in which the effective resistance of the transistor 92 varies, this modulation causes the resultant modulated signal to vary only between a minimum peak-to-peak magnitude substantially equal to the quiescent amplitude of the carrier signal and a maximum peak-to-peak magnitude which can be up to several hundred percent of the quiescent amplitude. That is, the minimum peak-to-peak magnitude of the modulated signal will never decrease from the quiescent or near quiescent amplitude.

This type of modulation is established because during quiescence when no transducer signal is received, only the DC bias provided by the clamp reference voltage means and the amplifier means 80 appears on the gate of the transistor 92. This voltage holds the transistor 92 near cut-off thereby making the effective resistance between the drain and the source of the transistor 92 very high. With this resistance very high, the gain of the modulator means 64 is low (approximately 1) thereby providing a modulated signal which is substantially equal to the carrier signal.

On the other hand, when a sound is detected by the microphone 28, a transducer signal is present which causes instantaneous variations in the effective drain-to-source resistance of the transistor 92 because the gate thereof is no longer maintained at or near cut-off. The instantaneous value of the effective drain-to-source resistance of the transistor 92 changes inversely in a nearly linear fashion with the instantaneous value of the conditioned modulating signal provided at the output of the operational amplifier 78. Thus, as the conditioned modulating signal 3 from the operational amplifier 78 goes to its maximum value, the effective drain-to-source resistance of the transistor 92 goes to its minimum value thereby raising the gain of the operational amplifier 86 to its maximum value. For the preferred embodiment, the aforementioned instantaneous values by which the instantaneous effective drain-to-source resistance of the transistor 92 is governed and to which it is inversely proportional are the instantaneous voltage values of the operational amplifier 78 output.

This modulation-up can thus produce an output from the operational amplifier 86 which is several hundred percent of the quiescent magnitude of the carrier signal. Yet, when the clamped signal at the output of the operational amplifier 78 swings to its lowest instantaneous valve, the amplitude of the modulated signal from the operational amplifier 86 drops toward its minimum peak-to-peak magnitude which is at or near the quiescent value of the carrier signal provided by the carrier signal generating means 24. The modulated signal at the output of the operational amplifier 86 never goes into overmodulation. Despite this unique operation of the present invention, the dynamic qualities of the original signal from the microphone 28 are retained. The only change from the original signal is that a very low frequency component has been generated and summed with the original modulating signal by the clamping means; however, this is usually inconsequential because the very low frequency component is below the threshold audio frequency level.

Therefore, a novel apparatus and a novel method of amplitude modulation are achieved by the present invention. By the novel apparatus and method, a signal is modulated-up but not significantly modulated-down. That is, the modulating signal operates on the carrier signal to produce a modulated signal which is unique in that the carrier signal is caused to increase from its quiescent value by as much as several hundred percent as the modulating signal goes to its maximum value but is not caused to vary appreciably from its quiescent value when the modulating signal goes to its minimum value. By such apparatus and method, modulation values of several hundred percent can be achieved without producing overmodulation and the resultant signal distortions. Although such novel apparatus and method have been described with reference to their uses with people who have hearing disabilities, it is to be noted that the present invention is contemplated to have other uses as in the military, citizen band and commercial radio applications referred to hereinabove.

Thus, the present invention is well adapted to carry out the objects and attain the ends and advantages mentioned above as well as those inherent therein. While a preferred embodiment of the invention has been described for the purpose of this disclosure, numerous changes in the construction and arrangement of parts and steps can be made by those skilled in the art, which changes are encompassed within the spirit of this invention as defined by the appended claims.

What is claimed is:

1. In an amplitude modulation apparatus of the type wherein a modulating signal having a peak-to-peak value is used for modulating a carrier signal having a quiescent peak-to-peak value, the improvement comprising modulation means for providing a modulated signal having peak-to-peak values within a range, and only within said range, between a value substantially equal to said quiescent peak-to-peak value and a value which is a multiple of said quiescent peak-to-peak value, said multiple being determined by said modulating signal peak-to-peak value, said modulating signal having magnitude excursions in two directions between upper peak values and lower peak values; and said modulation means including:

signal conditioning means for shifting said modulating signal by a variable amount so that said magnitude excursions in one of said two directions never exceed a predetermined value; and carrier signal modulator means, responsive to said signal conditioning means, for multiplying the magnitude of said carrier signal by variable multiplication factors.

2. The improvement as defined in claim 1, wherein said variable multiplication factors vary between approximately one when the magnitude of said modulating signal is at said predetermined value and a number greater than one when the magnitude of said modulating signal is at the end of one of said magnitude excursions in the other of said two directions.

3. The improvement as defined in claim 1, wherein said carrier signal modulator means includes variable resistance means for providing a resistance when the magnitude of said modulating signal is at said predetermined value and for providing a smaller resistance when the magnitude of said modulating signal is other than said predetermined value.

4. The improvement defined in claim 3, wherein said multiple is a positive number.

5. The improvement as defined in claim 3, wherein said multiple is greater than two.

6. An amplitude modulation apparatus for modulating a carrier signal with a modulating signal, said apparatus comprising:

modulating signal adjustment means for modifying the amplitude of the modulating signal, said modulating signal adjustment means including:
  first amplifier means, having an input and an output, for amplifying the modulating signal;
  reference voltage means for providing a reference voltage;
  capacitance means for coupling the modulating signal to said input of said first amplifier means; and
  diode means for electrically connecting said input of said first amplifier means and said reference voltage means; and second amplifier means, responsive to said modulating signal adjustment means, for amplifying the carrier signal by variable amplification factors, said variable amplification factors being dependent upon the modified amplitude of the modulating signal at said output of said first amplifier means.

7. An amplitude modulation apparatus for modulating a carrier signal with a modulating signal, said apparatus comprising:

modulating signal adjustment means for modifying the amplitude of the modulating signal; and amplifier means, responsive to said modulating signal adjustment means, for amplifying the carrier signal by variable amplification factors, said variable amplification factors being depending upon the modified amplitude of the modulating signal, said amplifier means including variable resistance means for providing said variable amplification factors, said variable resistance being controlled by said modulating signal adjustment means.

8. An amplitude modulation apparatus as defined in claim 7, wherein said modulating signal adjustment means includes clamping means for shifting a magnitude of the modulating signal.

9. An amplitude modulation apparatus as defined in claim 8, wherein:

said modulating signal adjustment means further includes:
  second amplifier means having an input and an output; and
  reference voltage means for providing a predetermined reference voltage; and said clamping means includes:
  a diode having a first end electrically connected to said reference voltage means and having a second end electrically connected to said input of said second amplifier means; and
  capacitance means having a first end for receiving the modulating signal and having a second end electrically connected to said input of said second amplifier means.

10. An amplitude modulation apparatus as defined in claim 9, wherein said variable resistance means includes a transistor electrically connected to said output of said second amplifier means, said transistor having a cut-off voltage substantially at which said transistor is maintained in response to said reference voltage means when no modulating signal is present at the first end of said capacitance means.

11. An amplitude modulation apparatus as defined in claim 7, wherein said variable resistance means includes a transistor having a cut-off voltage substantially at which said transistor is maintained by said modulating signal adjustment means when no modulating signal is present.

12. An amplitude modulation apparatus for modulating a carrier signal with a modulating signal, said apparatus comprising:

modulating signal adjustment means for modifying the amplitude of the modulating signal, said modulating signal adjustment means including:
  first amplifier means having an input and an output;
  reference voltage means for providing a predetermined reference voltage; and
  clamping means, associated with the input of said first amplifier means and with said reference voltage means, for shifting a magnitude of the modulating signal received by said clamping means; and second amplifier means, responsive to said modulating signal adjustment means, for amplifying the carrier signal by variable amplification factors, said variable amplification factors being dependent upon the modified amplitude of the modulating signal, said second amplifier means including variable resistance means, electrically connected to the output of said first amplifier means, for providing said variable amplification factors, said variable resistance means being maintained at a maximum resistance in response to said reference voltage means when no modulating signal is present.

13. An amplitude modulation apparatus as defined in claim 12, wherein:

said reference voltage means includes a first diode having its anode electrically connected to an electrical reference;

said clamping means includes:

a second diode having its anode electrically connected to the cathode of said first diode; and a capacitor having a first end for receiving the modulating signal and having a second end electrically connected to the cathode of said second diode and to the input of said second amplifier means; and said variable resistance means includes a transistor having a gate terminal electrically connected to the output of said second amplifier means.

14. An amplitude modulation apparatus, comprising:

transducer means for transducing an acoustical signal into an electrical signal;

first amplifier means having an input and an output;

capacitance means for coupling said electrical signal to said input of said first amplifier means;

means for providing a predetermined reference voltage;

diode means electrically connected between said input of said first amplifier means and said means for providing a predetermined reference voltage;

second amplifier means including an input, an output, and a variable resistance means, said variable resistance means having a resistance control terminal electrically connected to said output of said first amplifier means;

carrier signal generating means for generating a carrier signal; and means for coupling said carrier signal to said input of said second amplifier means for being modulated thereby in response to the resistance of said variable resistance means, the modulated carrier signal being provided at said output of said second amplifier means.

15. An amplitude modulation apparatus as defined in claim 14, wherein said transducer means includes third amplifier means having an input and an output and further including:

parallel circuit means including resistance means and diode means electrically connected between said input and said output of said third amplifier means; and series circuit means including another resistance means and capacitance means electrically connected between said input of said third amplifier means and an electrical reference potential.

* * * * *

UNITED STATES PATENT AND TRADEMARK OFFICE
CERTIFICATE OF CORRECTION

PATENT NO. : 4,617,536
DATED : October 14, 1986
INVENTOR(S) : Gordon L. Richard

It is certified that error appears in the above-identified patent and that said Letters Patent are hereby corrected as shown below:

Column 2, line 58, after "and" insert --10--;

Column 3, lines 49 and 50, change "impared" to --impaired--;

Column 7, line 14, change "this" to --thus--;

Column 9, lines 22 and 23, change "operationa" to --operational--;

Column 12, line 18, change "valve" to --value--; and

Column 13 (claim 7), line 65, change "depending" to --dependent--.

Signed and Sealed this

Thirtieth Day of December, 1986

Attest:

DONALD J. QUIGG

*Attesting Officer*        *Commissioner of Patents and Trademarks*